(12) United States Patent
Shakya et al.

(10) Patent No.: US 12,163,982 B2
(45) Date of Patent: Dec. 10, 2024

(54) MICROBUMP CLUSTER PROBING ARCHITECTURE FOR 2.5D AND 3D DIES

(71) Applicant: Intel Corporation, Santa Clara, CA (US)

(72) Inventors: Jagat Shakya, Hillsboro, OR (US); Ethan Caughey, Hillsboro, OR (US); Joseph Parks, Jr., Portland, OR (US)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 17/709,487

(22) Filed: Mar. 31, 2022

(65) Prior Publication Data

US 2023/0314479 A1 Oct. 5, 2023

(51) Int. Cl.
| | | |
|---|---|---|
| *G01R 1/073* | (2006.01) | |
| *G01R 1/02* | (2006.01) | |
| *G01R 1/04* | (2006.01) | |
| *G01R 1/067* | (2006.01) | |
| *G01R 31/26* | (2020.01) | |
| *G01R 31/28* | (2006.01) | |
| *G01R 35/00* | (2006.01) | |

(52) U.S. Cl.
CPC ..... *G01R 1/07342* (2013.01); *G01R 1/06733* (2013.01); *G01R 31/2891* (2013.01)

(58) Field of Classification Search
CPC . G01R 1/02; G01R 1/04; G01R 1/067; G01R 1/073; G01R 31/00; G01R 31/02; G01R 31/20; G01R 31/26; G01R 31/28; G01R 35/00
See application file for complete search history.

(56) References Cited

U.S. PATENT DOCUMENTS

| | | | |
|---|---|---|---|
| 9,217,758 B2* | 12/2015 | Torreiter | G01R 1/073 |
| 2007/0063721 A1* | 3/2007 | Dozier, II | G01R 31/2889 |
| | | | 324/754.03 |
| 2008/0106279 A1* | 5/2008 | Caldwell | G01R 31/2887 |
| | | | 324/754.03 |
| 2013/0069683 A1* | 3/2013 | Kuo | H05K 3/00 |
| | | | 324/755.03 |

* cited by examiner

*Primary Examiner* — Neel D Shah

(74) *Attorney, Agent, or Firm* — Viering, Jentschura & Partner mbB

(57) ABSTRACT

The present disclosure is directed to an inspection tool having a probe head with a probe card with a plurality of probes for performing testing, each of the probes being configured with a first end attached to the probe card and a second end for engaging microbumps coupled to a semiconductor die, the plurality of probes including a first set of probes having a first cross-sectional dimension, the first set of probes being arranged in a first set of locations on the probe card, and a second set of probes having a second cross-sectional dimension, the second set of probes being arranged in a second set of locations on the probe card, and a stage for holding the semiconductor die.

16 Claims, 8 Drawing Sheets

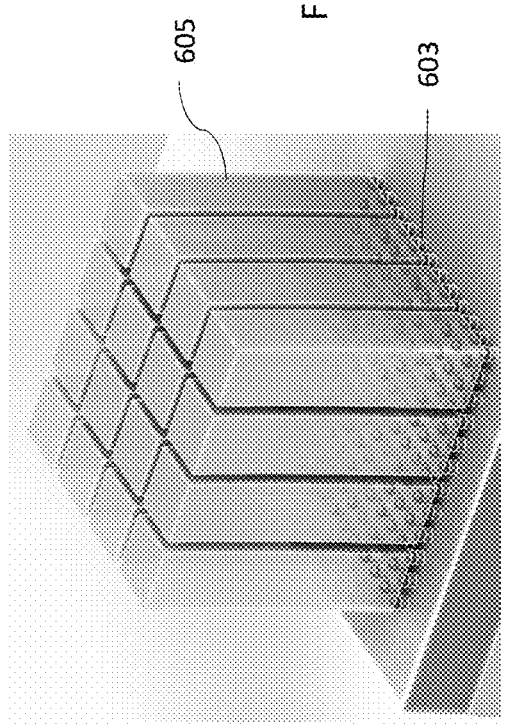
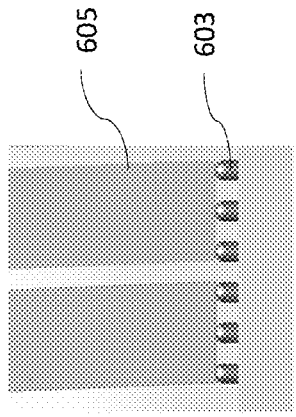
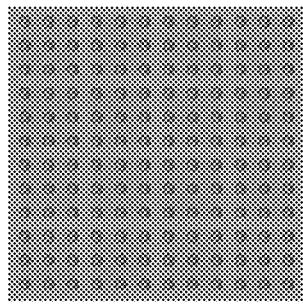
FIG. 6
FIG. 6B
FIG. 6A

MICROBUMP CLUSTER PROBING ARCHITECTURE FOR 2.5D AND 3D DIES

BACKGROUND

In semiconductor manufacturing, integrated circuit testing may be conducted at two levels, which are wafer-level testing or die sort that inspects/tests the dies on a semiconductor wafer, and package-level testing or final test that inspects after semiconductor assembly and packaging. Wafer-level testing is a critical step and ideally should be performed on every wafer and every silicon die to avoid defective semiconductor dies going through the assembly process leading to unnecessary costs.

Presently, inspection tools/testers may be generally categorized into logic testers, memory testers, and analog testers. A tester will send electrical signals to a semiconductor device to compare output signals against expected values for the purpose of the testing to see if the device works as specified in its design specifications. For wafer level testing, a tester uses a prober/probe head and a probe card. The probes/needles of the probe card contact the chip contact/electrodes to conduct electrical testing for a go/no-go test. A digital wafer map may be attached to each wafer that has been tested to label the passing and non-passing dies.

While it is preferred to have every chip be subjected to a Known Good Die (KGD) test to independently validate its performance prior to stacking in 2D/3D products, it may not economically feasible if the cost of testing outweighs the value-added provided when the test process is completed. Accordingly, semiconductor inspection/testing processes may benefit from additional inspection tools, systems, and methods that can reduce costs and improve efficiency to allow for high yields and low defect levels in the semiconductor manufacturing process.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 2 and 2A show a schematic diagram of an exemplary intra-die testing;

FIGS. 3 and 3A show diagrams providing the key dimensions for native pitch probing;

FIGS. 5, 5A, and 5B show diagrams of exemplary probes in patterns according to an aspect of the present disclosure;

FIGS. 6, 6A, and 6B show diagrams of a set of exemplary probes according to another aspect of the present disclosure;

DETAILED DESCRIPTION

Figure 1:
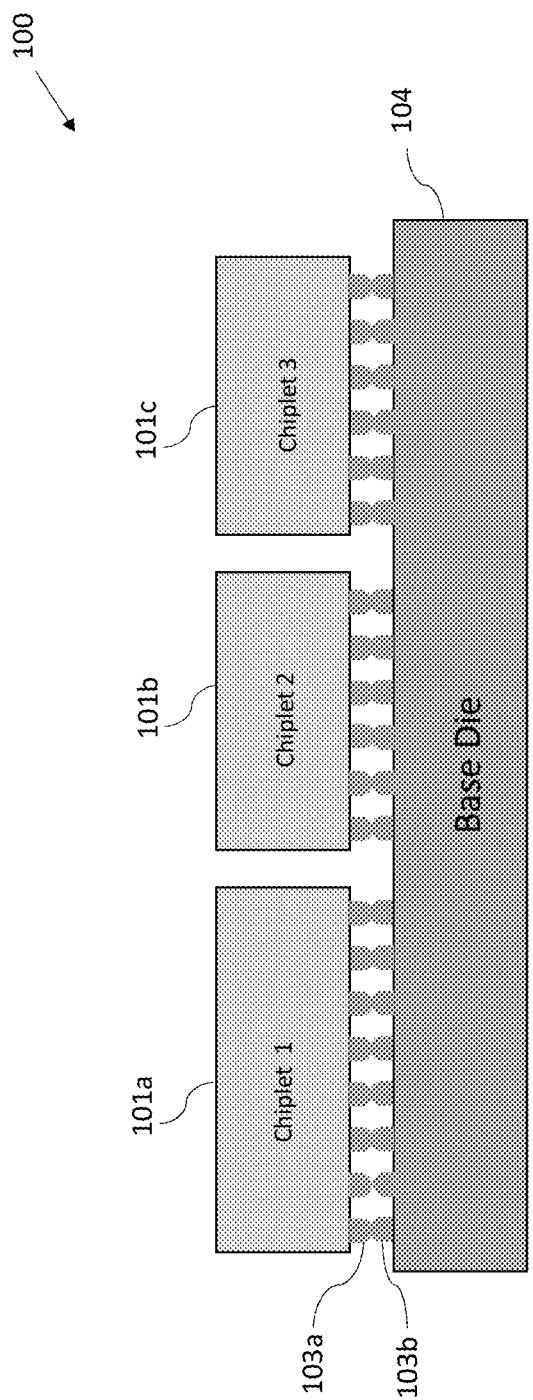
FIG. 1 shows a schematic diagram of an exemplary 2.5D/3D stack chip.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is directed to an inspection method for a semiconductor die with a plurality of microbumps. The microbumps providing connectivity for related types of signals are arranged in set locations within a first pattern. The present method positions the semiconductor die on a stage of an inspection tool for testing. The inspection tool uses a probe head including a probe card with a plurality of probes, and the probes are arranged in set locations within a second pattern. The testing method may be performed by contacting each of the probes to one or more of the microbumps on the semiconductor die and followed by producing a map with the testing results for the semiconductor die.

The present disclosure is also directed to an inspection system that includes an inspection tool having a probe card with a plurality of probes, with each of the probes being configured with a first end attached to the probe card and a second end for engaging one or more microbumps coupled to a semiconductor die. In addition, the plurality of probes includes a first set of probes with a first cross-sectional dimension, with the first set of probes being arranged in a first set of locations on the probe card, and a second set of probes with a second cross-sectional dimension, with the second set of probes being arranged in a second set of locations on the probe card. The present inspection tool captures data relating to a defect density of the semiconductor die by having the first and second sets of probes engage the microbumps on the semiconductor die; the semiconductor die is one of a plurality of semiconductor dies on a wafer being inspected by the inspection tool. Thereafter, a computing device/processor coupled to the inspection tool generates a wafer map based on inspection results from the inspection tool.

The present disclosure is further directed to an inspection tool that includes a probe head with a probe card having a plurality of probes for performing testing. Each of the probes may be configured with a first end attached to the probe card and a second end for engaging one or more microbumps coupled to a semiconductor die. The plurality of probes including a first set of probes having a first cross-sectional dimension, with the first set of probes being arranged in a first set of locations on the probe card, and a second set of probes having a second cross-sectional dimension, with the second set of probes being arranged in a second set of locations on the probe card, and a stage or electrostatic chuck for holding the semiconductor die.

To more readily understand and put into practical effect, the present microbump cluster probing architecture for wafer inspection tools, inspection systems and methods, which may be used for 2.5D and 3D semiconductor packages, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIG. 1 shows a schematic diagram of an exemplary 2.5D/3D stack chip 100 having three chiplets 101a, 101b, and 101c and a base die 104. The fine pitch assembly with 2.5D and 3D die stacking architecture requires the use of solder to solder microbumps 103a and 103b, respectively, to form connections between the top chiplets 101a, 101b, and 101c and the bottom base die 104. As shown, it is typical to have the microbump pattern of the top chiplets will correspond to the microbump pattern of the base die. In a 2.5D and 3D die assembly, the operational die disaggregation allows flexibility to assemble different chiplets from multiple sources and multiple technologies on the same base die, which makes the testing of these various component chips even more important.

Figure 2:
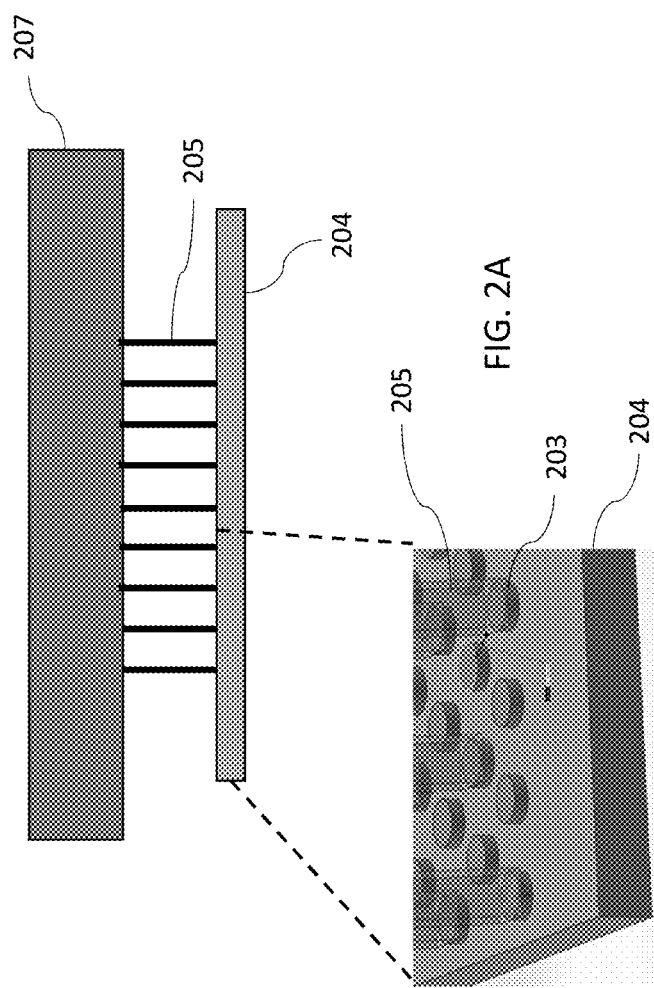

In FIG. 2, an example of intra-die testing is shown, with a die 204 in contact with probes 205 for testing. In this instance, due to the shorting margin of the probing process, the plurality of microbumps 203 may not all be tested given the difficulties that arise with probing at "native" or minimum pitch. The probes 205 may be positioned on a probe card 207 at a larger pitch to avoid shorting and will not engage with all of the microbumps, i.e., columns and rows are skipped.

Figure 3:
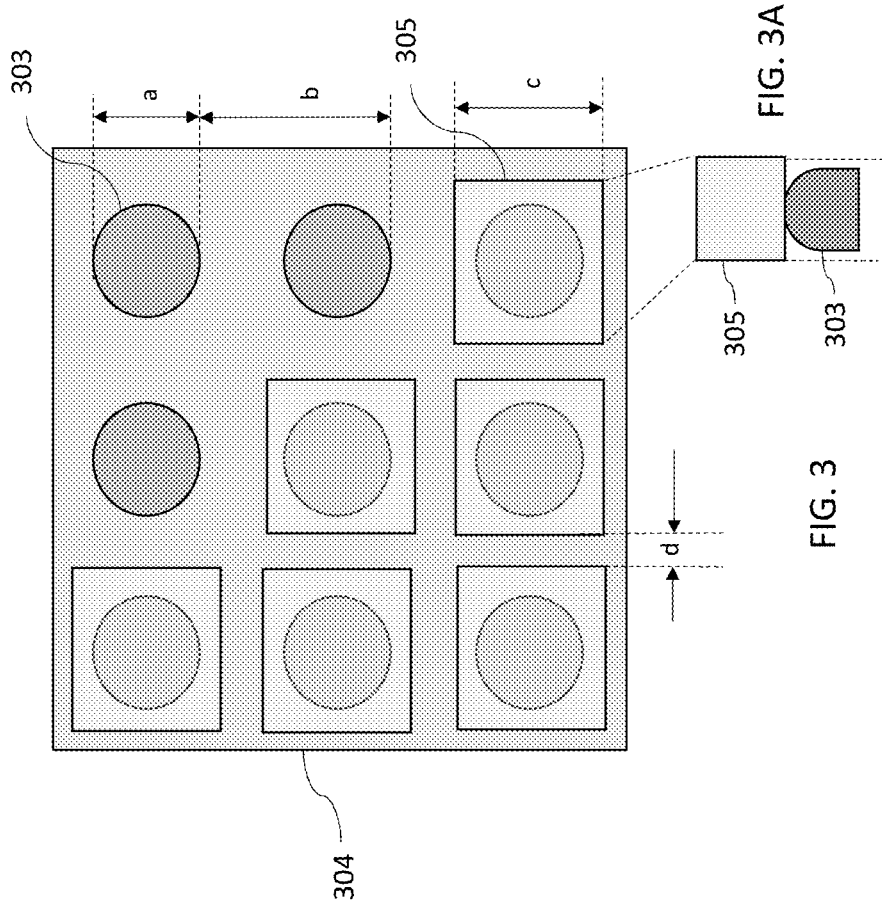

FIGS. 3 and 3A show diagrams that illustrate the key dimensions of concern for native pitch probing on a die 304 with microbumps 303. The starting point is the critical dimension (CD) for the microbumps 303, which is shown as "a", and the bump pitch (P), which is shown as "b". To perform native pitch probing, a probe 305 will have a probe tip size (L), which is shown as "c", and a probe-to-probe shorting distance (SM), which is shown as "d", and these dimensions for the probe will be largely determined by the dimensions for the microbumps.

As shown in FIG. 3A, each probe 305 may be configured with an engagement surface area that corresponds with its cross-sectional dimension, and the engagement surface area is normally greater than a top surface area of each microbump 303. It is also important that the probes have dimensions that allow for sufficient transmission of power for testing while providing adequate separation to avoid unintended short-circuiting. It is understood that the aforementioned dimensions must be considered when designing probe layouts for probe cards and microbump layouts on semiconductor dies.

Figure 4:
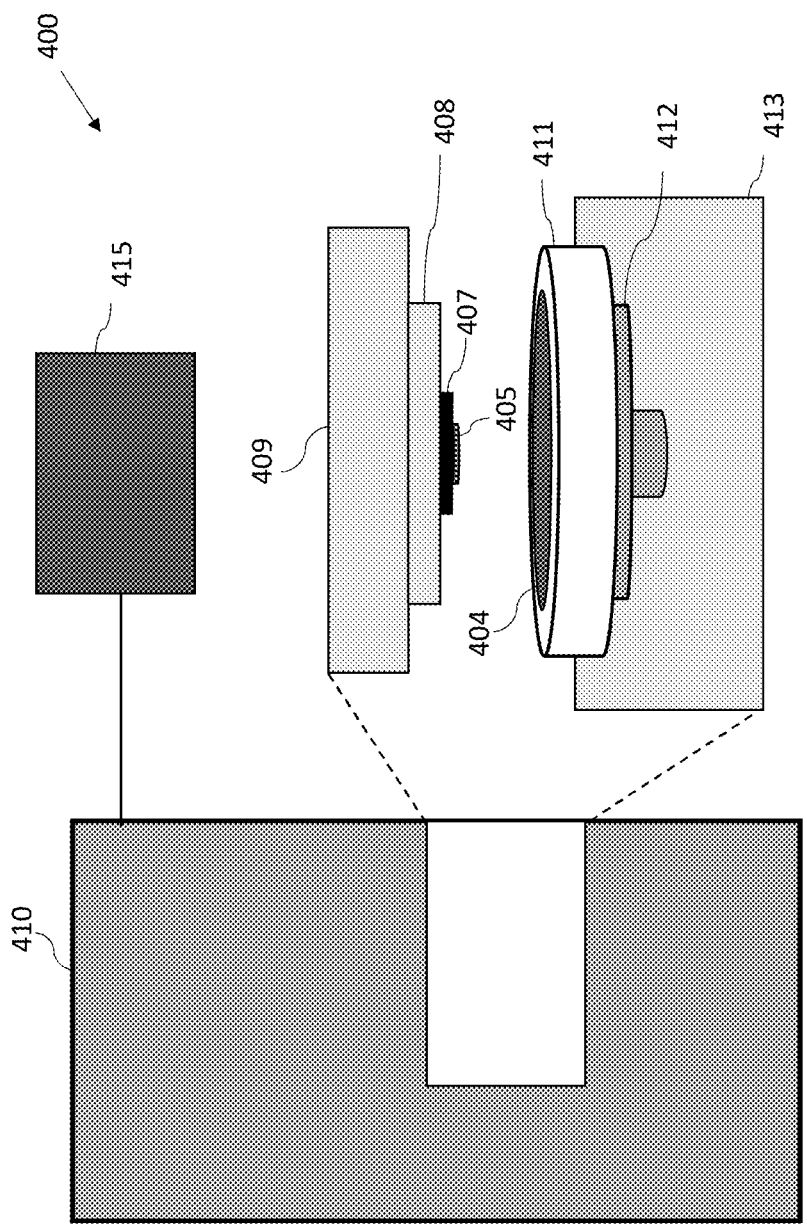
FIG. 4 shows a schematic diagram of an exemplary wafer test system.

In FIG. 4, an exemplary wafer test system 400 is shown. The wafer test system 400 may include an inspection tool 410 that is coupled to a computing device or processor 415. The processor 415 may be a standalone unit or a server (not shown) in a foundry computer network. The wafer test system may include a wafer handler unit and control system (both not shown).

As shown in FIG. 4, the inspection tool may include a probe head 409, a positioning mechanism 408, and an attached probe card 407 with probes 405. The probe card 407 and probes 405 may be of types as set forth in the present disclosure. A wafer 404 may be provided for inspection/testing and placed on stage or platform 411 (e.g., an electrostatic chuck) that is attached to a pedestal 412 in a support structure 413. The wafer 404 may have a plurality of semiconductor dies (not shown) that are individually inspected/tested.

In addition, the wafer inspection system 400 may use software with pre-programmed patterns for the scanning of surfaces of a wafer, which may be stored in the processor 415 or remotely in a server (not shown). The use of pre-programmed patterns may permit the scans to be performed in an automated process and provide for generating selective scans (e.g., greater or lesser number of dies) as needed. In an aspect, a control software may be used to control the operations and movements of the inspection tool 410 (e.g., movement of the probe card in the x-direction, y-direction, and z-direction). In another aspect, the present wafer inspection system 400 may employ image analysis software for analyzing the captured data and generating data output and maps.

Figure 5:
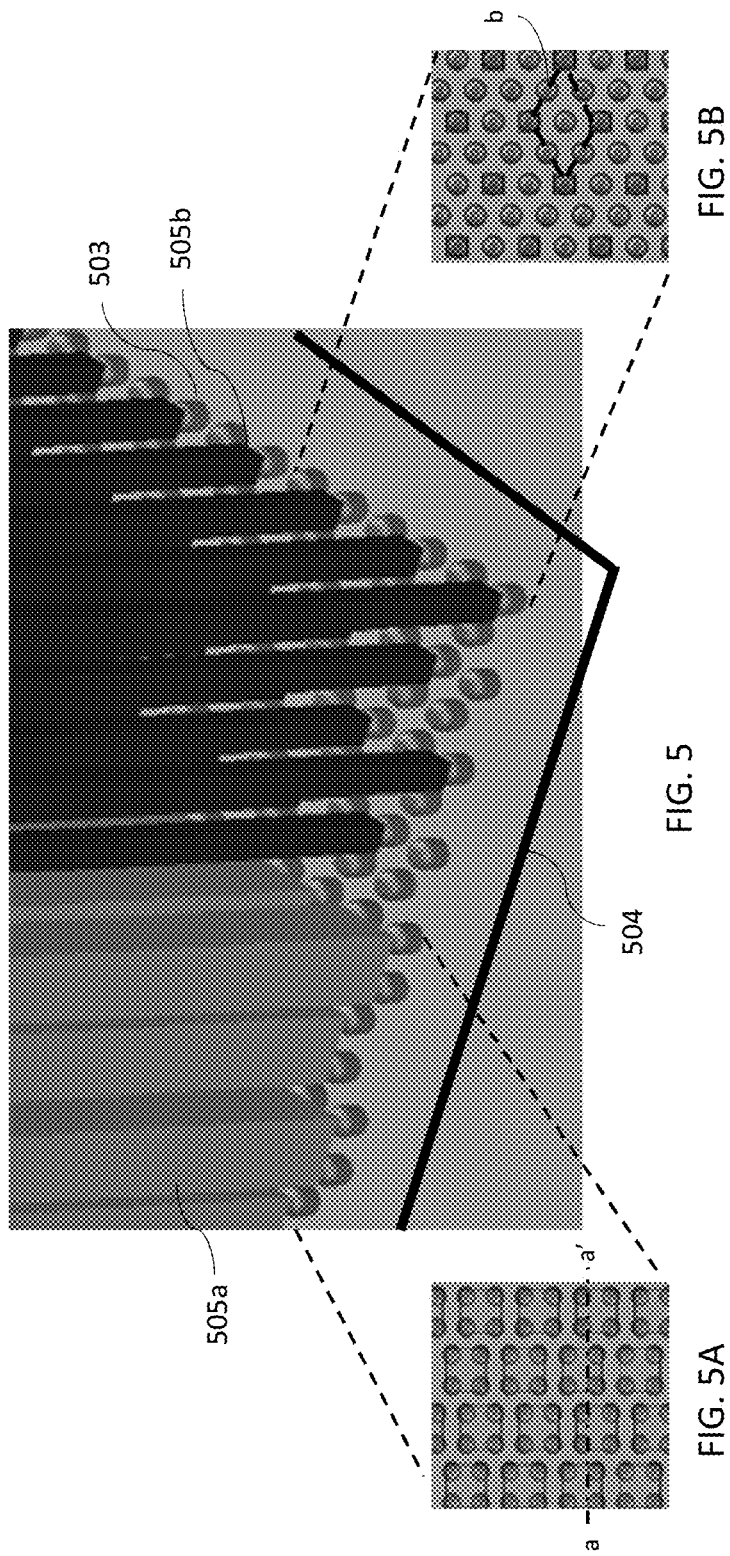

FIGS. 5, 5A, and 5B show diagrams of exemplary plurality probes in first and second sets of locations according to an aspect of the present disclosure. In FIG. 5, a plurality of probes is shown, for which a first set of probes 505a in the first location may have a first cross-sectional dimension and a second set of probes 505b in the second location may have a second cross-sectional dimension. In an aspect, the cross-sectional shape may be rectangular or square. In this aspect, the first set of probes 505a may have a cross-sectional dimension that permits it to engage four microbumps, which a "cluster" of four microbumps, which allows for high power, while the second set of probes 505b may a cross-sectional dimension that permits it to engage a single microbump. In yet another aspect, the first set of probes may be used for microbumps providing connectivity for power delivery and ground interconnections and the second set of probes may be used for microbumps providing connectivity for input-out signals. In an aspect, the present probes may be made using micro-electromechanical systems (MEMS) technology.

As shown in FIGS. 5A and 5B, a plurality of microbumps 503 may include a set of clustered microbumps and selected microbumps that form part of a first pattern on a semiconductor die 504. The first pattern may include the plurality of microbumps being formed into two or more sub-patterns, including differently configured clustered microbumps. As shown in FIG. 5, the first pattern has two sub-patterns.

In an aspect, a set of clustered microbumps may be used for related or the same type of signals and/or power delivery interconnects and may be arranged in designated or set locations in a microbump layout or pattern on the semiconductor die. The plurality of microbumps 503, including the set of clustered and selected microbumps may be located together as shown in FIG. 5. It should be understood that a microbump layout on semiconductor die may be arranged to multiple smaller and/or larger clusters of microbumps according to the present disclosure.

In another aspect, as shown in FIG. 5, the first set of probes and the second set of probes may form a second pattern. As shown in FIG. 5A, a first part of the second pattern may have probes 505a arranged in staggered rows (shown as being off-set from line a-a') and a second part of the second pattern may have probes 505b arranged in a repeating diamond-like shape "b" contacting the selected microbumps (tested), which are separated by one non-selected microbump (untested). According to the present disclosure, the use of sets of clustered microbumps may provide improved shorting margins and lower the number of probes needed for testing, thus reducing the overall cost of a probe card.

In another aspect, a second pattern may include one or more combinations of aligned rows, staggered rows, alternately spaced rows, symmetric interval rows, asymmetric interval rows, and other repeatable geometries, and the second pattern allows the first and second sets of probes, respectively, to engage the set of clustered and selected microbumps in the first pattern.

FIGS. 6, 6A, and 6B show diagrams of a plurality of probes 605 according to another aspect of the present disclosure. In this aspect, the probes 605 may have the same cross-sectional dimensions (i.e., the first and second sets of probes are identical) and be arranged in a second pattern that forms a grid-like shape. In addition, a plurality of microbumps 603 may be arranged in a grid-like shape as a first pattern. In this aspect, the probes 605 may have a cross-sectional dimension that permits it to engage nine microbumps 603, which is a cluster of nine microbumps.

Figure 7:
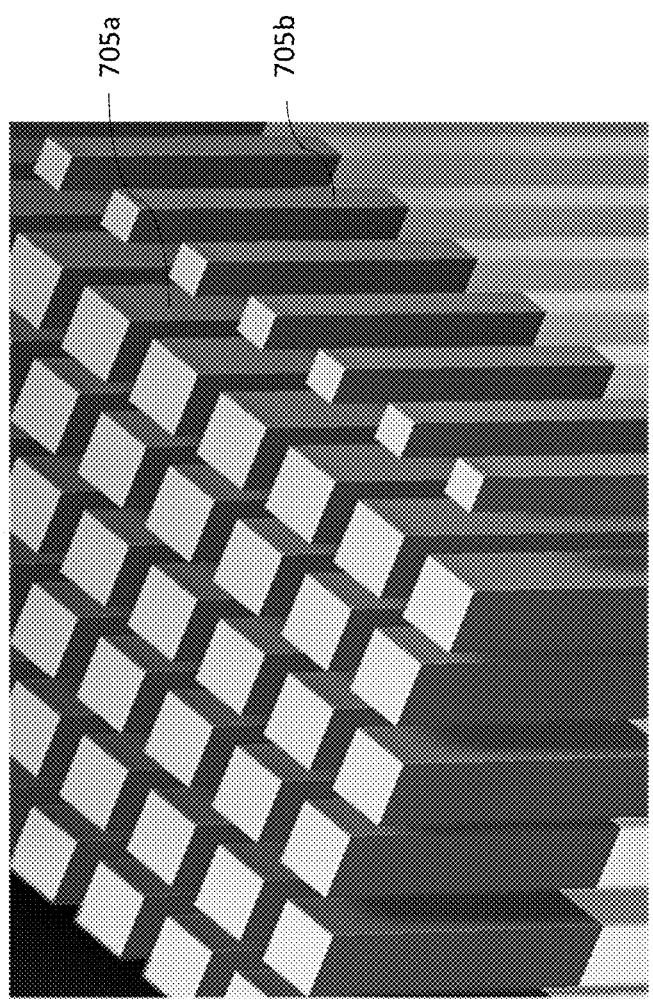
FIG. 7 shows a diagram of exemplary probes in a pattern according to yet another aspect of the present disclosure.

In FIG. 7, a diagram shows an exemplary plurality of probes in a second pattern of a first set of probes 705a and a second set of probes 705b according to yet another aspect of the present disclosure. In this aspect, a set of clustered microbumps may be located on an interior portion of a semiconductor die and may be engaged for testing by probes 705a, while selected microbumps may be located on a peripheral portion of a semiconductor die and may be engaged for testing by probes 705b. It should be understood that a microbump layout on a semiconductor die may include one or more microbumps for designed for specialized purposes that may be placed in "free" locations within a pattern according to the present disclosure.

Figure 8:
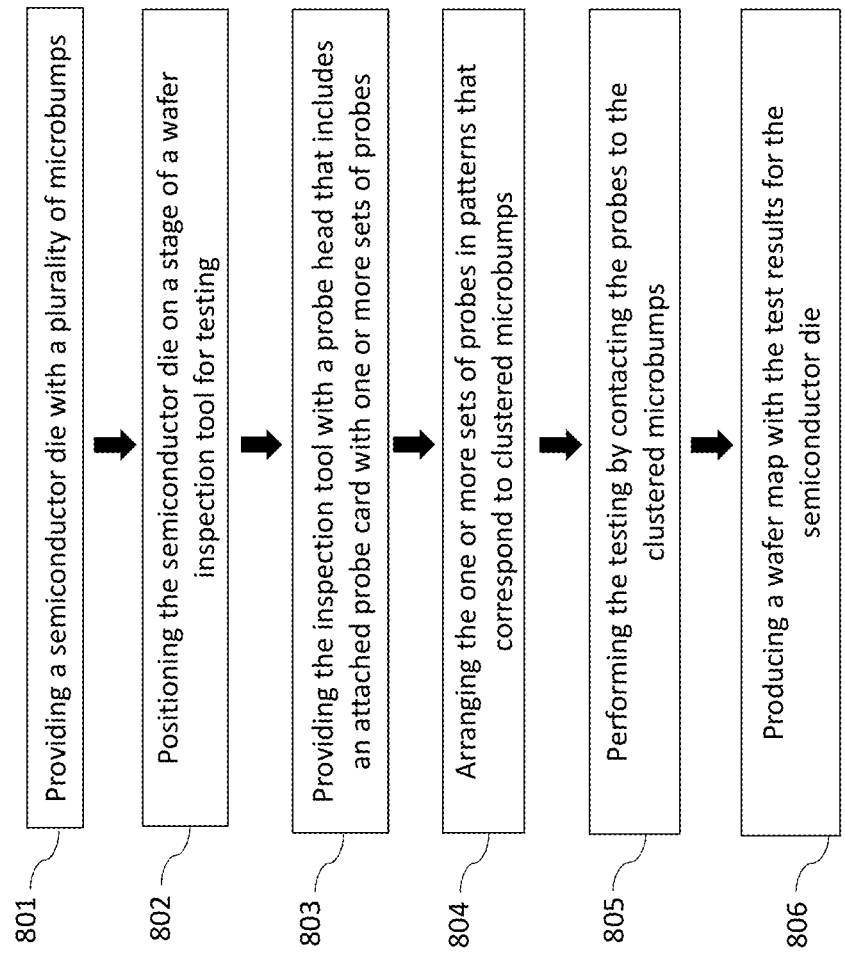
FIG. 8 shows a simplified flow diagram for an exemplary method according to an aspect of the present disclosure.

FIG. 8 shows a simplified flow diagram for an exemplary method for wafer inspection according to an aspect of the present disclosure.

The operation 801 may be directed to providing a semiconductor die with a plurality of microbumps.

The operation 802 may be directed to positioning the semiconductor die on a stage of a wafer inspection tool for testing.

The operation 803 may be directed to providing the inspection tool with a probe head that includes an attached probe card with one or more sets of probes.

The operation 804 may be directed to arranging the one or more sets of probes in patterns that correspond to clustered microbumps.

The operation 805 may be directed to performing the testing by contacting the probes to the clustered microbumps.

The operation 806 may be directed to producing a wafer map with the test results for the semiconductor die.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present metrology system and methods for their use in gap measurements, they will now be described by way of examples. For the sake of brevity, duplicate descriptions of features and properties may be omitted.

EXAMPLES

Example 1 provides an inspection method providing a semiconductor die with a plurality of microbumps, for which the microbumps that provide connectivity for related types of signals are arranged in set locations within a first pattern, positioning the semiconductor die on a stage of an inspection tool for testing, providing the inspection tool with a probe head including a probe card with a plurality of probes, for which the probes are arranged in set locations within a second pattern, performing the testing by contacting each of the probes to one or more of the microbumps on the semiconductor die and producing a map with the testing results for the semiconductor die.

Example 2 may include the method of example 1 and/or any other example disclosed herein, for which the semiconductor die is one of a plurality of semiconductor dies on a wafer being tested by the inspection tool.

Example 3 may include the method of example 1 and/or any other example disclosed herein, for which the plurality of probes further includes a first set of probes and a second set of probes, for which the first set of probes contact microbumps providing connectivity for a first type of signal and the second set of probes contact microbump providing connectivity for a second type of signal.

Example 4 may include the method of example 3 and/or any other example disclosed herein, for which the first set of probes have a first cross-sectional dimension and a second set of probes with a second cross-sectional dimension and for which the first cross-sectional dimension permits engagement with more than one microbump and the second set of probes with the second cross-sectional dimension permits engagement with one microbump.

Example 5 provides an inspection system including an inspection tool including a probe card with a plurality of probes, each of the probes being configured with a first end attached to the probe card and a second end for engaging one or more microbumps coupled to a semiconductor die, the plurality of probes including a first set of probes with a first cross-sectional dimension, the first set of probes being arranged in a first set of locations on the probe card and a second set of probes with a second cross-sectional dimension, the second set of probes being arranged in a second set of locations on the probe card, for which the inspection tool captures data relating to a defect density of the semiconductor die by having the first and second sets of probes engage the microbumps on the semiconductor die, for which the semiconductor die is one of a plurality of semiconductor dies on a wafer being inspected by the inspection tool, a processor coupled to the inspection tool for generating a wafer map based on inspection results from the inspection tool.

Example 6 may include the inspection system of example 5 and/or any other example disclosed herein, for which the second end of each probe is configured with an engagement surface area that corresponds with its cross-sectional dimension, for which the engagement surface area is equal to or greater than a top surface area of each microbump.

Example 7 may include the inspection system of example 6 and/or any other example disclosed herein, for which the first set of probes with the first cross-sectional dimension engages with more than one microbump and the second set of probes with the second cross-sectional dimension engages with one microbump.

Example 8 may include the inspection system of example 5 and/or any other example disclosed herein, for which the wafer map shows the plurality of semiconductor dies that are passing and non-passing based on their defect density.

Example 9 provide an inspection tool including a probe head, a probe card with a plurality of probes for performing testing, each of the probes being configured with a first end attached to the probe card and a second end for engaging one or more microbumps coupled to a semiconductor die, the plurality of probes including a first set of probes having a first cross-sectional dimension, the first set of probes being arranged in a first set of locations on the probe card, and a second set of probes having a second cross-sectional dimension, the second set of probes being arranged in a second set of locations on the probe card, and a stage for holding the semiconductor die.

Example 10 may include the inspection tool of example 9 and/or any other example disclosed herein, for which the first set of locations of the first set of probes correspond to positions of a set of clustered microbumps on the semiconductor die and the second set of locations of the second set of probes correspond to positions of selected microbumps on the semiconductor die.

Example 11 may include the inspection tool of example 10 and/or any other example disclosed herein, for which the positions of the set of clustered and selected microbumps on the semiconductor die form part of a first pattern and the first and second sets of locations for the first and second sets of probes form a second pattern.

Example 12 may include the inspection tool of example 11 and/or any other example disclosed herein, for which the second pattern includes one or more combinations of aligned rows, staggered rows, alternately spaced rows, symmetric interval rows, asymmetric interval rows, and/or other repeatable geometries, and the second pattern allows the first and second sets of probes, respectively, to engage the set of clustered and selected microbumps in the first pattern.

Example 13 may include the inspection tool of example 9 and/or any other example disclosed herein, for which the second end of each probe is configured with an engagement surface area that corresponds with its cross-sectional dimension.

Example 14 may include the inspection tool of example 13 and/or any other example disclosed herein, for which the engagement surface area is equal to or greater than a top surface area of each microbump.

Example 15 may include the inspection tool of example 13 and/or any other example disclosed herein, for which the engagement surface area is equal to or greater than the top surfaces of a plurality of microbumps.

Example 16 may include the inspection tool of example 9 and/or any other example disclosed herein, for which the first set of probes with the first cross-sectional dimension engages with more than one microbump and the second set of probes with the second cross-sectional dimension engages with one microbump.

Example 17 may include the inspection tool of example 10 and/or any other example disclosed herein, for which the set of clustered microbumps provides power delivery and ground connections.

Example 18 may include the inspection tool of example 10 and/or any other example disclosed herein, for which the selected microbumps provide input-output signal connections.

Example 19 may include the inspection tool of example 9 and/or any other example disclosed herein, for which the probe card with the plurality of probes is removable from the inspection tool and replaceable with a second probe card with a second plurality of probes with a third set of probes and a fourth set of probes.

Example 20 may include the inspection tool of example 9 and/or any other example disclosed herein, for which the probe card further includes the first and second sets of probes that have the same cross-sectional dimensions and are arranged in a same pattern on the probe card.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An inspection method comprising:
providing a semiconductor die with a plurality of microbumps, wherein the microbumps that provide connectivity for related types of signals are arranged in set locations within a first pattern;
positioning the semiconductor die on a stage of an inspection tool for testing;
providing the inspection tool with a probe head, the probe head comprising
a probe card with a plurality of probes, wherein the probes are arranged in set locations within a second pattern, wherein the plurality of probes comprises a first set of probes and a second set of probes, wherein each of the first set of probes is configured to contact a cluster of multiple ones of the plurality of microbumps, each microbump of which is of a cluster signal type providing connectivity for a first type of signal, wherein each of the second set of probes is configured to contact only a single one of the plurality of microbumps, wherein the single one is of a single signal type that is different from the cluster signal type providing connectivity for a second type of signal that is different from the first type of signal;
performing the testing by contacting each of the first set of probes to its cluster of the multiple ones of the plurality of microbumps on the semiconductor die and by contacting each of the second set of probes to its single one of the plurality of microbumps on the semiconductor die; and
producing a map with the testing results for the semiconductor die.

2. The method of claim 1, wherein the semiconductor die is one of a plurality of semiconductor dies on a wafer being tested by the inspection tool.

3. An inspection system comprising:
an inspection tool comprising:
a probe card with a plurality of probes, each of the probes being configured with a first end attached to the probe card and a second end for engaging one or more microbumps coupled to a semiconductor die;

the plurality of probes comprising a first set of probes with a first cross-sectional dimension, the first set of probes being arranged in a first set of locations on the probe card and a second set of probes with a second cross-sectional dimension, the second set of probes being arranged in a second set of locations on the probe card, wherein each of the first set of probes is configured to contact a cluster of multiple ones of the one or more microbumps, each microbump of which is of a cluster signal type providing connectivity for a first type of signal, wherein each of the second set of probes is configured to contact only a single one of the one or more microbumps, wherein the single one is of a single signal type that is different from the cluster signal type providing connectivity for a second type of signal that is different from the first type of signal;

wherein the inspection tool captures data relating to a defect density of the semiconductor die by having the first and second sets of probes engage the microbumps on the semiconductor die, wherein the semiconductor die is one of a plurality of semiconductor dies on a wafer being inspected by the inspection tool;

a processor coupled to the inspection tool for generating a wafer map based on inspection results from the inspection tool.

4. The inspection tool of claim 3, wherein the second end of each probe is configured with an engagement surface area that corresponds with its cross-sectional dimension, wherein the engagement surface area is equal to or greater than a top surface area of each microbump.

5. The inspection system of claim 4, wherein the first set of probes with the first cross-sectional dimension engages with more than one microbump and the second set of probes with the second cross-sectional dimension engages with one microbump.

6. The inspection system of claim 3, wherein the wafer map shows the plurality of semiconductor dies that are passing and non-passing based on their defect density.

7. An inspection tool comprising:
a probe head;
a probe card with a plurality of probes for performing testing, each of the probes being configured with a first end attached to the probe card and a second end for engaging one or more microbumps coupled to a semiconductor die;
the plurality of probes comprising:
a first set of probes having a first cross-sectional dimension, the first set of probes being arranged in a first set of locations on the probe card, wherein each of the first set of probes is configured to contact a cluster of multiple ones of the one or more microbumps, each microbump of which is of a cluster signal type providing connectivity for a first type of signal; and a second set of probes having a second cross-sectional dimension, the second set of probes being arranged in a second set of locations on the probe card, wherein each of the second set of probes is configured to contact only a single one of the one or more microbumps, wherein the single one is of a single signal type that is different from the cluster signal type providing connectivity for a second type of signal that is different from the first type of signal; and a stage for holding the semiconductor die.

8. The inspection tool of claim 7, wherein the first set of locations of the first set of probes correspond to positions of the clusters on the semiconductor die and the second set of locations of the second set of probes corresponds to positions of the single ones on the semiconductor die.

9. The inspection tool of claim 7, wherein the first and second sets of probes are arranged in a pattern comprising one or more combinations of staggered rows, alternately spaced rows, symmetric interval rows, asymmetric interval rows, and/or other repeatable geometries.

10. The inspection tool of claim 7, wherein the second end of each probe is configured with an engagement surface area that corresponds with its cross-sectional dimension.

11. The inspection tool of claim 10, wherein the engagement surface area is equal to or greater than a top surface area of each microbump.

12. The inspection tool of claim 10, wherein the engagement surface area is equal to or greater than the top surfaces of a plurality of microbumps.

13. The inspection tool of claim 7, wherein the cluster signal type is for power delivery and ground connections.

14. The inspection tool of claim 7, wherein the single signal type comprises an input-output signal connection.

15. The inspection tool of claim 7, wherein the probe card with the plurality of probes is removable from the inspection tool and replaceable with a second probe card with a second plurality of probes with a third set of probes and a fourth set of probes.

16. The inspection tool of claim 7, wherein the probe card further comprises the first and second sets of probes have the same cross-sectional dimensions and are arranged in a same pattern on the probe card.

* * * * *